United States Patent
Luke et al.

(10) Patent No.: US 6,745,264 B1
(45) Date of Patent: Jun. 1, 2004

(54) METHOD AND APPARATUS FOR CONFIGURING AN INTERFACE CONTROLLER WHEREIN PING PONG FIFO SEGMENTS STORES ISOCHRONOUS DATA AND A SINGLE CIRCULAR FIFO STORES NON-ISOCHRONOUS DATA

(75) Inventors: David Luke, Boise, ID (US); Frederick Pew, Meridian, ID (US); Kris Provencio, Boise, ID (US)

(73) Assignee: Cypress Semiconductor Corp., San Jose, CA (US)

( * ) Notice: Subject to any disclaimer, the term of this patent is extended or adjusted under 35 U.S.C. 154(b) by 65 days.

(21) Appl. No.: 10/196,106

(22) Filed: Jul. 15, 2002

(51) Int. Cl.[7] .................. G06F 9/445; G06F 13/14; G06F 13/00; G06F 13/40
(52) U.S. Cl. ................ 710/52; 710/8; 710/22; 710/53; 710/104; 710/105; 710/100; 710/305
(58) Field of Search ................ 710/8, 22, 52, 710/53, 104, 105, 100, 305

(56) References Cited

U.S. PATENT DOCUMENTS

| | | | | |
|---|---|---|---|---|
| 6,070,208 A | * | 5/2000 | Brief | 710/104 |
| 6,173,355 B1 | * | 1/2001 | Falik et al. | 710/310 |
| 6,266,715 B1 | * | 7/2001 | Loyer et al. | 710/22 |
| 6,408,351 B1 | * | 6/2002 | Hamdi et al. | 710/63 |
| 6,523,081 B1 | * | 2/2003 | Karlsson et al. | 710/305 |
| 2002/0065966 A1 | * | 5/2002 | Brief | 710/100 |
| 2002/0078283 A1 | * | 6/2002 | Pucell et al. | 710/109 |
| 2003/0041205 A1 | * | 2/2003 | Wu et al. | 710/302 |

* cited by examiner

*Primary Examiner*—Jeffrey Gaffin
*Assistant Examiner*—Tammara Peyton
(74) *Attorney, Agent, or Firm*—Marger Johnson & McCollom, P.C.

(57) ABSTRACT

Hardware Description Language (HDL) code is created for an interface controller so that logic requiring device-specific configuration refers to a parameter file. This set of parameters lets components in a bridge circuit provide support for the same configuration. In another aspect of the invention, a control circuit identifies isochronous endpoints and non-isochronous endpoints. A buffer is configured into a first FIFO mode for isochronous endpoints and configured into a second FIFO mode for non-isochronous endpoints.

17 Claims, 8 Drawing Sheets

Figure 1 - Single Circular FIFO
(BACKGROUND)

Figure 2 - Ring Configuration of Single Buffers
(BACKGROUND)

METHOD AND APPARATUS FOR CONFIGURING AN INTERFACE CONTROLLER WHEREIN PING PONG FIFO SEGMENTS STORES ISOCHRONOUS DATA AND A SINGLE CIRCULAR FIFO STORES NON-ISOCHRONOUS DATA

BACKGROUND

Universal Serial Bus (USB) device interface controller logic usually consists of a transceiver interface, protocol engine, endpoint recognition logic, and special First In-First Out buffers (FIFOs) that handle some of the peculiar requirements of USB data transfer. In a processor-based device, one or more Direct Memory Access (DMA) engines are typically needed to move data into and out of the FIFOs.

In a typical design, these functions are discrete. The USB transceiver interface, protocol engine, and endpoint recognition logic may be available in one package. Alternatively, it may be implemented as three logical entities with the FIFOs and DMAs being separate components. Considerable effort may be required to select the proper pieces and interface them together.

Further, the endpoint recognition logic, FIFOs, and DMAs must be properly configured for each application. Configuration of the endpoint recognition logic is typically done either by hardcoding values into the logic itself, or by using scripts to modify code. The former approach is time-consuming and not very flexible. The latter approach typically results in code and logic that is difficult to understand and debug, and that is also rather inflexible. The FIFOs and DMA engines are typically configured and instantiated by hand, another time-consuming and error-prone process.

Another design methodology is to create hardware with some limited number of physical endpoints. These endpoints are then mapped to logical endpoints and controlled by software. This method provides even less flexibility in the design process and limited flexibility in using the designed hardware. This method suffers from the same issues of trying to interface separately designed components, or in designing new components from the ground up with matching interfaces.

Isochronous data transfers refer to processes where data is delivered with certain time constraints. For example, multimedia streams require an isochronous transport mechanism to ensure that data is delivered at the constant rate required for audio or video regeneration.

Figure 1:
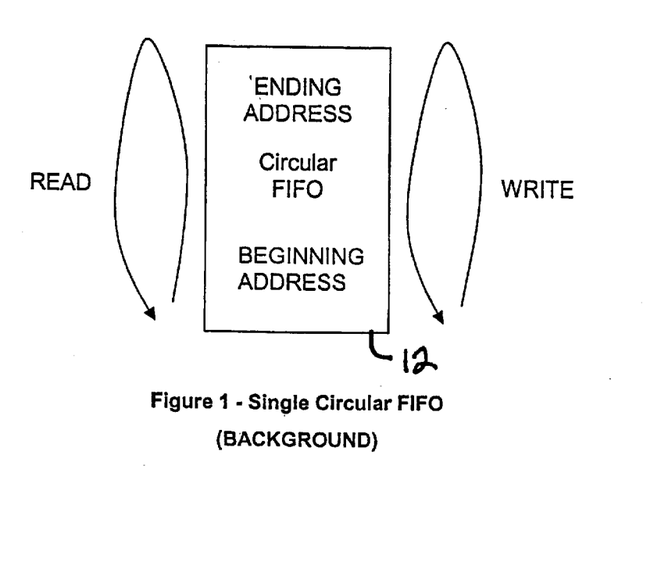
FIG. 1 is a diagram of a single circular FIFO.
Figure 2:
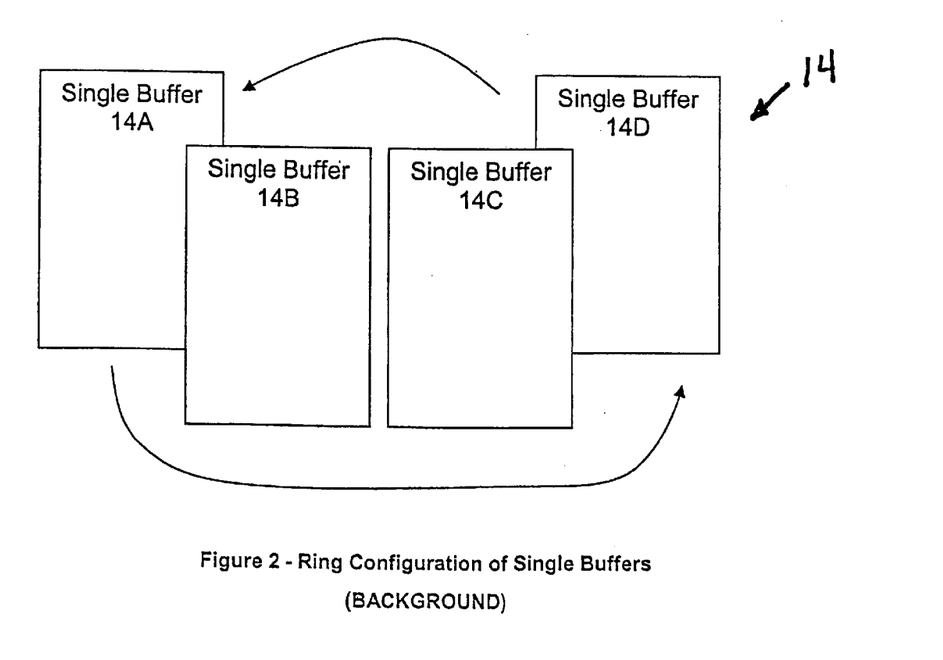
FIG. 2 is a diagram of a ring configuration of single buffers.

A single circular FIFO buffer 12 is shown in FIG. 1. A ring configuration using multiple buffers 14 is shown in FIG. 2. The buffer configurations in FIGS. 1 and 2 can each be used for processing isochronous data streams. In the singular circular FIFO 12 shown in FIG. 1, the isochronous data is placed in the buffer 12 starting at a beginning address. Once data reaches the end of the FIFO 12, data starts over at the beginning address. Data can be read from the buffer 12 or written to the buffer 12 at any time.

In the case of the ring configuration of multiple buffers 14 shown in FIG. 2, the individual buffers 14 are sized according to the amount of data in the packets transporting the data either to or from the buffer. Once buffer 14A is full (or empty), the data starts moving to or from buffer 14B, and so on. Each individual buffer 14A–14D is dedicated to only read or only write data until the buffer is either full or empty.

These two types of buffers have problems with an isochronous data flow. One problem with the buffers is the inefficiency in keeping track of the (micro)frame number associated with the isochronous data. Isochronous data transfers require that a time be associated with the appropriate data. Some mechanism must be in place to maintain that association.

In the case of the single circular FIFO 12, the (micro)frame information would typically be embedded in the isochronous data, along with any header information. This scheme requires hardware to read the information out of the buffer, parse it to detect the header and frame information, and then extract the isochronous data.

The ring configuration of single buffers 14 also does not efficiently track frame numbers, as it would also typically embed the (micro)frame information in the isochronous data. Ring architectures can also accomplish the same task by instantiating registers associated with each buffer 14A–14D to hold the (micro)frame information. But this requires additional hardware.

While the circular FIFO 12 is inefficient for isochronous transfers, it may be more efficient in handling other types of transfers, such as for Universal Serial Bus (USB) bulk, control, and interrupt transfers. In the case where a design requires an endpoint to transfer bulk data in one configuration and isochronous data in another configuration, different buffers are required for each configuration.

The present invention addresses this and other problems associated with the prior art.

SUMMARY OF THE INVENTION

Hardware Description Language (HDL) code is created for an interface controller so that logic requiring device-specific configuration refers to a parameter file. This set of parameters lets each of the components comprising the interface circuit provide support for a common configuration. Changing the hardware configuration of the entire interface controller system may be accomplished by simply modifying the one parameter file. These changes are then automatically reflected in all the components of the controller.

In another aspect of the invention, a control circuit divides a single memory into buffer partitions for each physical endpoint and identifies each endpoint as either isochronous or non-isochronous. A buffer partition is configured into a first FIFO mode for isochronous endpoints and configured into a second FIFO mode for non-isochronous endpoints.

The foregoing and other objects, features and advantages of the invention will become more readily apparent from the following detailed description of a preferred embodiment of the invention which proceeds with reference to the accompanying drawings.

DETAILED DESCRIPTION

Figure 3:
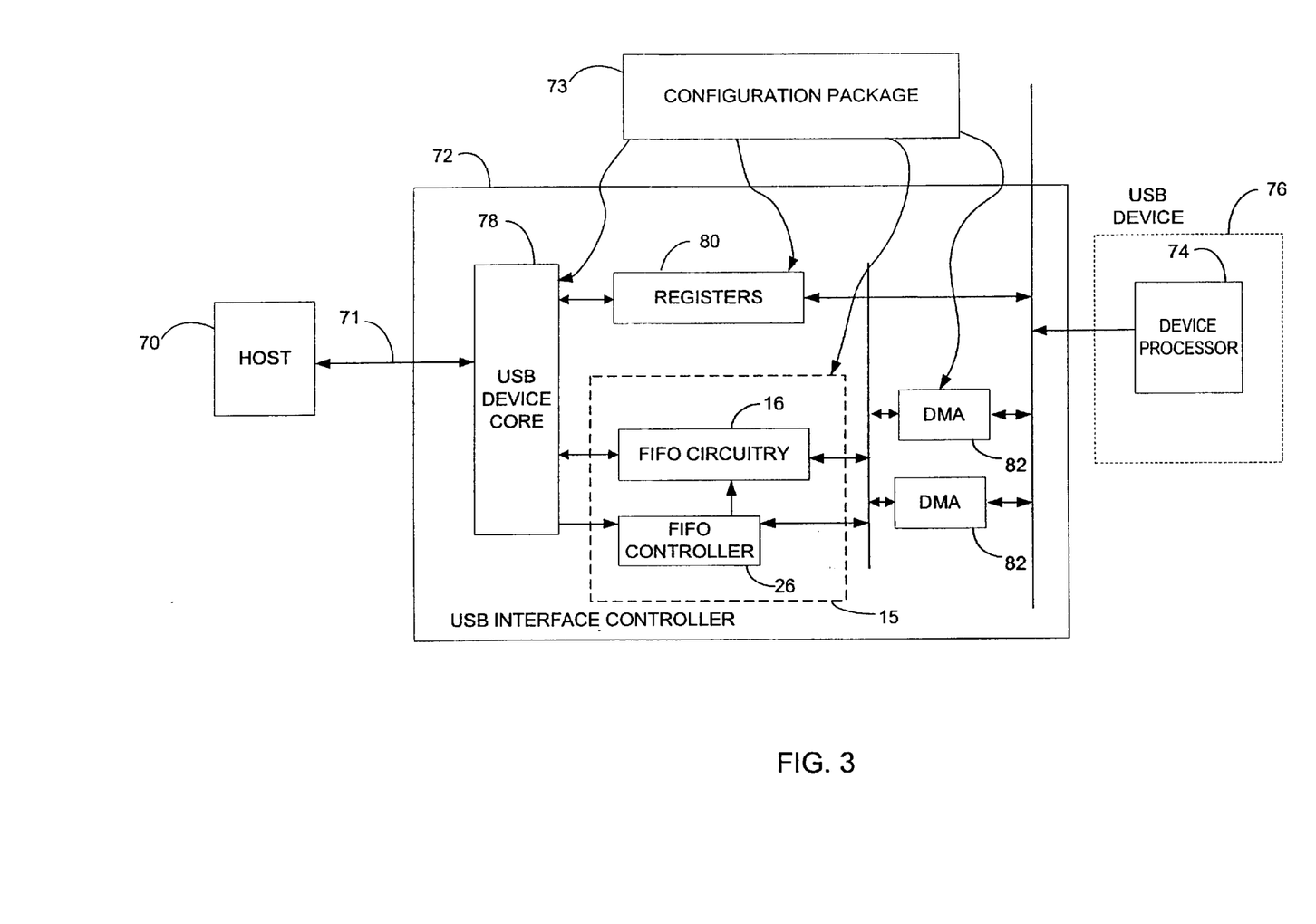
FIG. 3 is a block diagram of an interface controller.

FIG. 3 shows a USB interface controller 72 that contains multiple different functional elements including a USB device core 78 for communicating with a host 70 over a USB interface 71. The USB device core 78 is known to those skilled in the art, and is therefore not described in further detail. Different registers 80 are used for storing configuration parameters and other data. A FIFO circuit 15 is used for buffering data transferred between the host 70 and a USB device 76. One or more Direct Memory Access (DMA) interface controllers 82 control data transfers between one or more data sources or sinks within the USB device 76.

The USB device 76 can be any device that needs to communicate with the host 70. There may be one or more data sources or sinks in the same USB device 76. For example, the USB device 76 may be a combination facsimile (FAX), copier, and printer where each function comprises one or more different USB data sources or sinks. Another USB device 76 coupled to the interface controller 72 may be a Digital Video Disc (DVD) player that outputs isochronous audio and video data streams. The FIFO circuit 15 is dynamically reconfigured for buffering the different types of data associated with the different data sources or sinks in USB device 76.

A configuration package 73 is used for configuring the different functional elements 78, 80, 15 and 82 in the interface controller 72 for N different physical endpoints (channels). A set of parameters in configuration package 73 may include the number of "physical endpoints" or "channels", each of which provides a means for handling an independent stream of data either to or from host 70.

Figure 4:
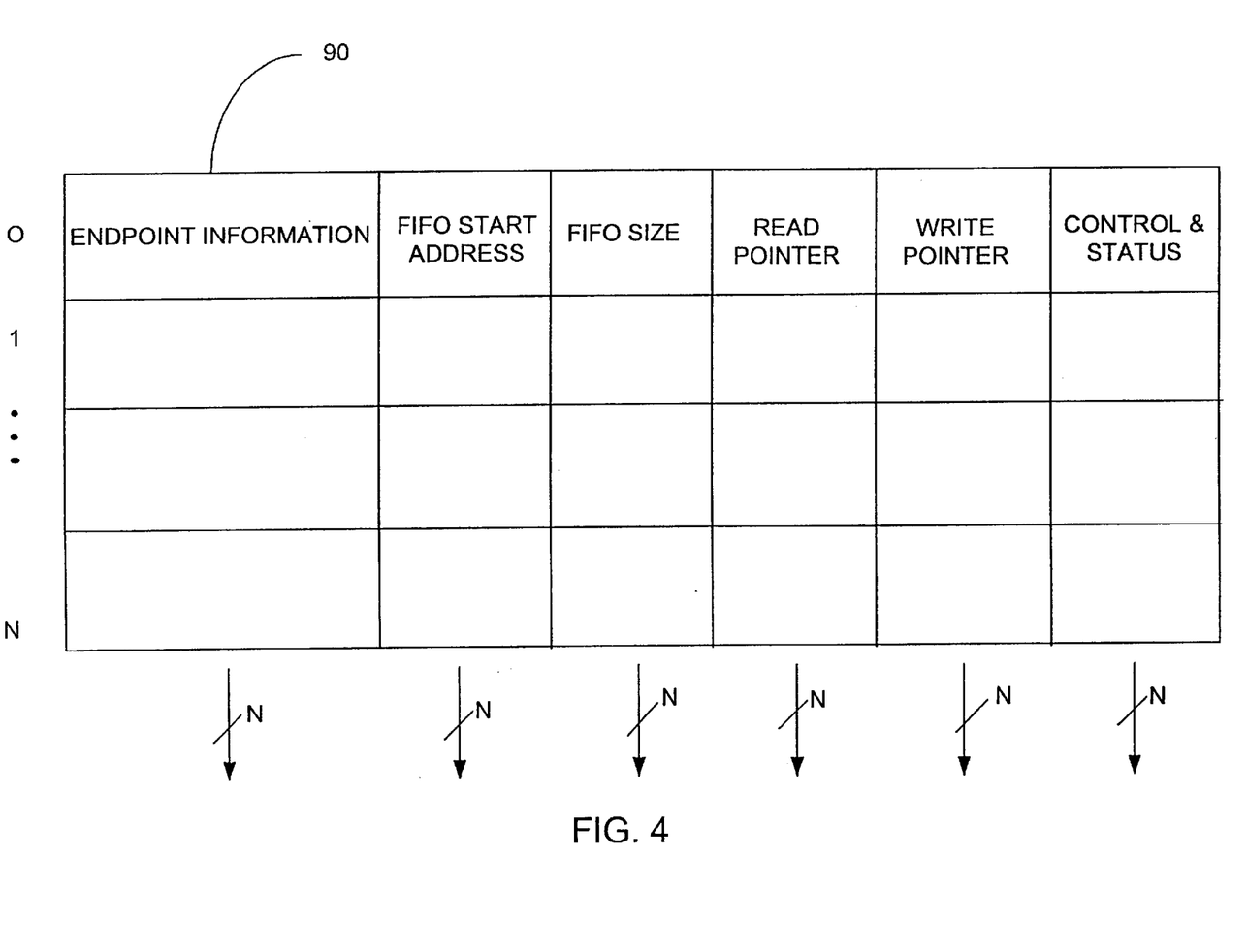
FIG. 4 is a diagram of a configuration register used in the interface controller shown in FIG. 3.

Instead of prefabricating one particular endpoint configuration in silicon, the configuration package 73 is used at Hardware Description Language (HDL) compile time to generate multiple configuration registers 90 shown in FIG. 4. The configuration registers 90 are each writeable and readable and allow the interface controller 72 to be configured on-the-fly for different USB endpoint configurations.

HDL code is written for the USB logic 78, registers 80, FIFO circuitry 15 and DMA engines 82 in a parameterized manner so that the configuration registers 90 are referred to for device-specific configuration information. For example, the FIFO circuitry 15 may be configured according to a set of configuration registers 90 that store the starting address and current address pointers for each USB channel. In another example, the DMA block 82 may instantiate either one discrete DMA channel, or one channel of a multi-channel DMA engine, for each physical endpoint.

For the hardware designer, changing the configuration of the interface controller 72 consists simply of changing the constant parameters in configuration package 73 and then re-synthesizing the logic. For the system designer, changing the USB configuration consists simply of using software to reprogram the configuration registers 90 for specific endpoint, FIFO, and DMA configuration information. Other details are handled automatically by the hardware.

The USB device core 78, FIFO circuitry 15, and DMAs 82 can be designed to be fully parameterized to work from a minimum USB configuration (one default pipe) to a maximum USB configuration (one default pipe plus around 30 other pipes). System software can then configure the entire USB interface controller 72 "on the fly" with freedom from hardware restrictions.

FIG. 4 shows examples of some fields that may be contained in the configuration registers 90. In addition to information about the characteristics of each endpoint which has been set up by software, the registers 90 may also contain FIFO configuration fields, including a FIFO start address field, FIFO size field, read pointer field, write pointer field, and control and status fields. One set of configuration registers 90 may be generated for each "physical endpoint" or "channel," based on constants set in the configuration package 73 shown in FIG. 3.

Thus, the USB interface controller 72 comprises a collection of integrated components including the USB device core 78, FIFO circuitry 15, DMA block 82, registers 80, and the interconnect between the various components that are all parameterized using constants in the configuration package 73.

This allows a designer to customize a USB interface controller for any desired application by simply changing one or two parameters in configuration package 73, and have the needed hardware inferred automatically. By changing only three or four characters in a configuration package text file, the designer can customize the hardware to support the minimum allowable USB configuration, the maximum allowable USB configuration, or anywhere in between.

Not only is the hardware customization automated and thus simpler and faster to design, but the parameterized HDL code provides a drastically higher degree of flexibility than other chip design techniques. Any "physical endpoint" or channel can be assigned any arbitrary USB endpoint number, type, direction, size, etc. Each of these endpoints can be associated with any arbitrary USB configuration or interface. Each can be provided with a FIFO of arbitrary size. This configuration circuitry can be used for any device that needs to operate with different system configurations.

Figure 5:
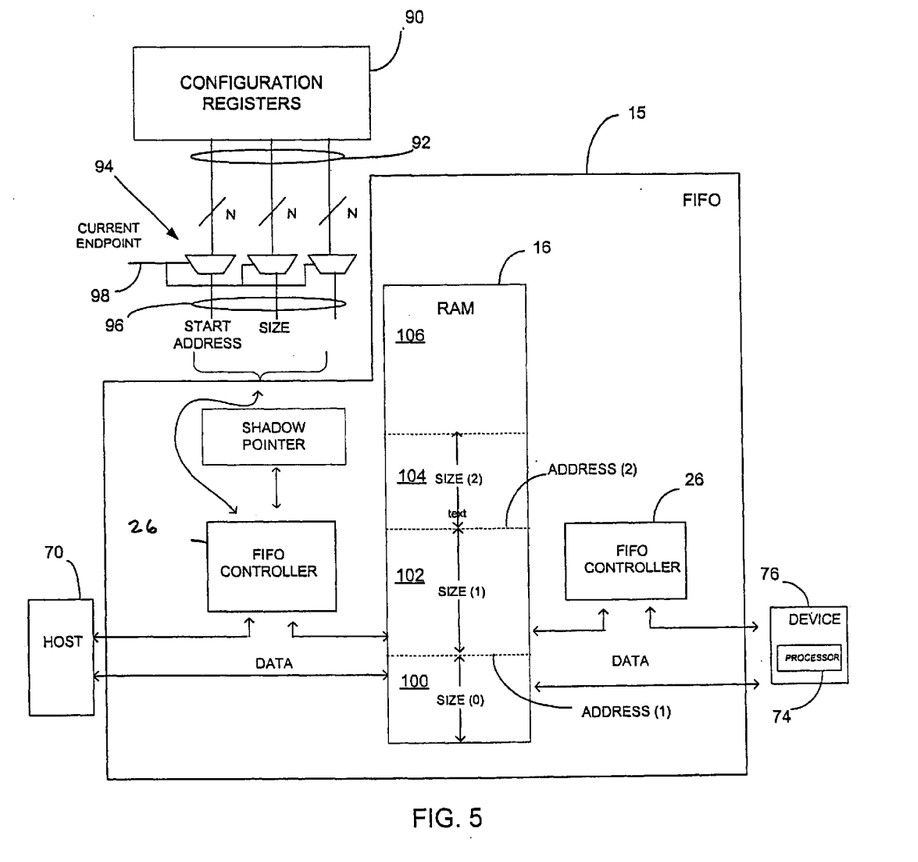
FIG. 5 is a diagram showing how the configuration register is used to dynamically configure a FIFO circuit.

FIG. 5 shows in more detail how the FIFO circuitry 15 interacts with the configuration registers 90. A configuration bus 92 is output from the configuration registers 90. The configuration bus 92 contains configuration information for each "physical endpoint" or "channel," based on constants set in the configuration package 73 (FIG. 3). A set of multiplexers 94 select the endpoint information 96 from configuration bus 92 associated with a current endpoint number 98.

Memory 16 is organized as a single block of random-access memory. In one embodiment, FIFO sections 100–106 of memory 16 are assigned to particular physical endpoints. A FIFO start address and FIFO size for each channel are loaded into the configuration registers 90 (see FIG. 4). In one example, the FIFO configuration values are loaded into the configuration registers 90 by a software controlled processor 74 in the USB device 76. The FIFO configuration information in configuration registers 90 is then used by the FIFO controller 26 to divide the memory 16 into multiple FIFO regions 100–106. Since the FIFO configuration values in configuration registers 90 can be set by software, the size and number of FIFO regions 100–106 can be configured on-the-fly, for example, during a reset or initialization process.

In typical designs, the amount of buffer available to any endpoint is fixed at hardware design time, and is often limited to a fixed number of packets. However, the start address and size information output by the configuration registers 90 allow the size of each FIFO region 100, 102, 104 and 106 in memory 16 to be varied dynamically. In one situation, the entire memory 16 could be assigned to one endpoint. In another situation, a minimal amount of memory, or some amount of memory in between, is assigned to each endpoint.

The DMA blocks 82 in FIG. 3 can be similarly configurable. Values from the configuration package 73 (FIG. 3) are used to fix the number of supported channels at hardware synthesis time. The DMA block may be structured either as a bank of discrete DMA engines 82 (FIG. 3), with the number and connectivity of each engine controlled by constants in the configuration package 73 through the use of generate statements or similar constructs. Alternately, there may only be one DMA block 82 (FIG. 3) with a multichannel DMA engine. The engine is designed in a parameterized fashion so that the maximum number of supported channels is controlled by constants from the configuration registers 90.

Configurable-On-The-Fly Memory

Figure 6:
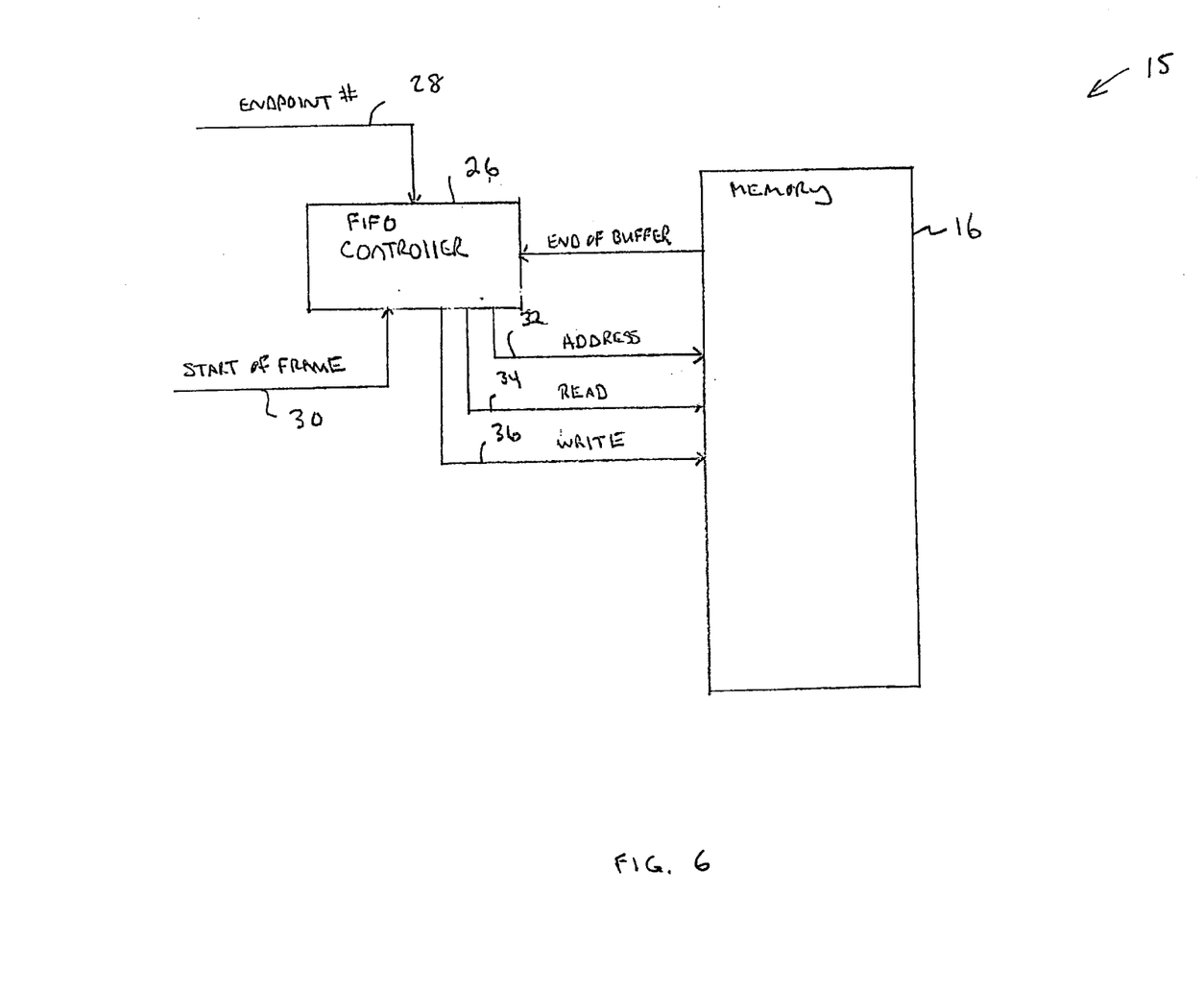
FIG. 6 is a diagram of a dynamically configurable FIFO circuit.

FIG. 6 shows the FIFO circuit 15 previously shown in FIG. 3 including the FIFO controller 26 and the memory 16. The FIFO controller 26 receives an endpoint number 28 associated with a USB device 76 (FIG. 3). A start of frame signal 30 indicates when a new frame begins. A frame is a period of time during which a certain amount of isochronous data must be transferred. A frame is delimited by consecutive start of frame signals 30. The FIFO controller 26 generates address values (pointers) 32 associated with read commands 34 (read pointers) and write commands 36 (write pointers). The read and write pointers are generated according to the type of data associated with the selected endpoint 28.

Figure 7:
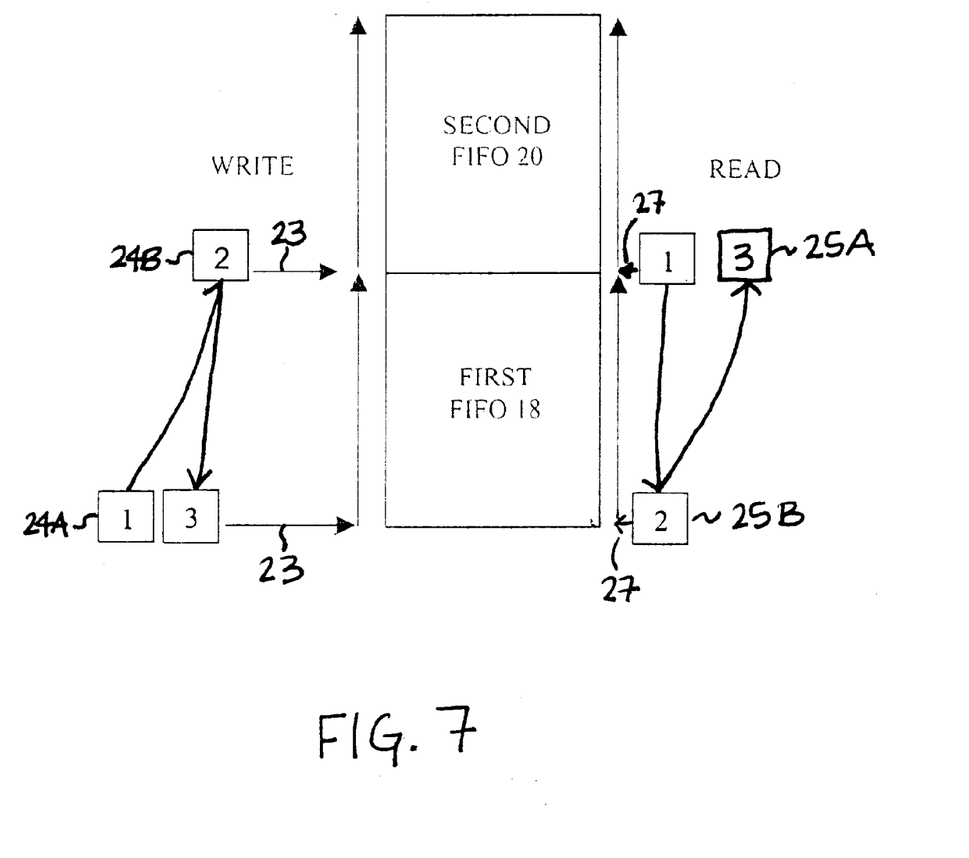
FIG. 7 is a diagram showing how a ping-pong FIFO operates.

FIG. 7 shows how the pointers are moved to handle either isochronous or non-isochronous reads or writes. The memory partition 16 is configured into a ping-pong buffer mode of operation for isochronous data and configurable on the fly into a single circular buffer for non-isochronous data.

If the data is identified as isochronous, the memory partition 16 is divided into two segments 18 and 20. When a frame of isochronous data is received, a write pointer 23 snaps to a beginning memory location 24A in the first segment 18. The write pointer 23 is incremented for each memory write, until another frame of isochronous data is received.

The write pointer 23 then jumps to a midpoint address 24B in memory partition 16 corresponding to a beginning location for segment 20. The write pointer 23 is incremented from location 24B as the isochronous data enters the memory partition 16. The start of the next isochronous frame causes the write pointer 23 to snap back to the beginning address 24C for the first segment 18.

The read pointer 27 operates similarly to the write pointer 23, but is held off while the first (micro)frame of isochronous data is written into segment 18. For example, when a second start of frame causes the write pointer 23 to move to memory location 24B, the read pointer 27 is set to memory location 25A. When the next frame is detected, the write pointer 23 snaps back to location 24C and the read pointer 27 is automatically moved to memory location 25B, and so on.

This creates a situation where data will be written into one half of the memory partition 16 and data will be read out from the other half of the memory partition 16 at the same time. The read and write pointers 23 and 27 operate in different segments 18 and 20 for any given (micro)frame. This allows a device a full (micro)frame time period to read data out of the memory partition 16.

For other types of data transfers, such as non-isochronous data, the memory partition 16 is configured as a single circular FIFO. The memory partition 16 is not divided in half, and the write and read pointers are incremented until they reach the last address of the memory partition. At that time, the pointer is returned to a beginning address. The pointer then continues to be incremented as data is placed or removed in memory partition 16. The memory partition 16 is empty or full when the read and write pointers point to the same address in memory 16.

Figure 8:
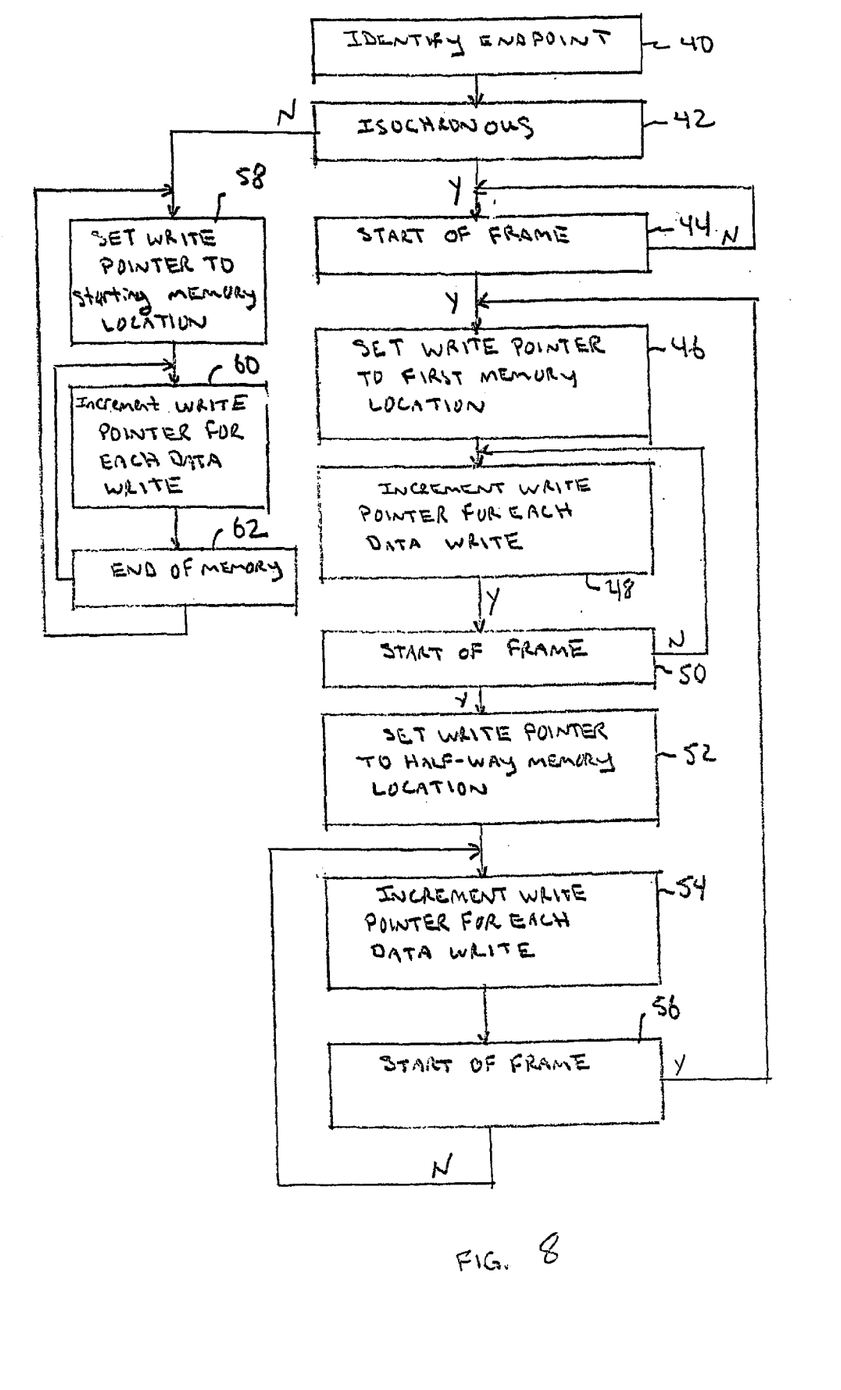
FIGS. 8 and 9 are flow diagrams showing how the FIFO circuit in FIGS. 6 and 7 operates.

FIG. 8 describes in further detail the write operations controlled by the FIFO controller 26. In block 40 the FIFO controller identifies a particular endpoint associated with the data to be buffered in the memory partition 16 (FIG. 7). If the endpoint is associated with isochronous data in block 42, the FIFO controller configures the memory partition 16 for a ping-pong operational mode in blocks 44–56. If the endpoint associated with the data transfer is not associated with isochronous data in block 42, the FIFO controller configures the memory 16 as a regular circular buffer in blocks 58–62.

Figure 9:
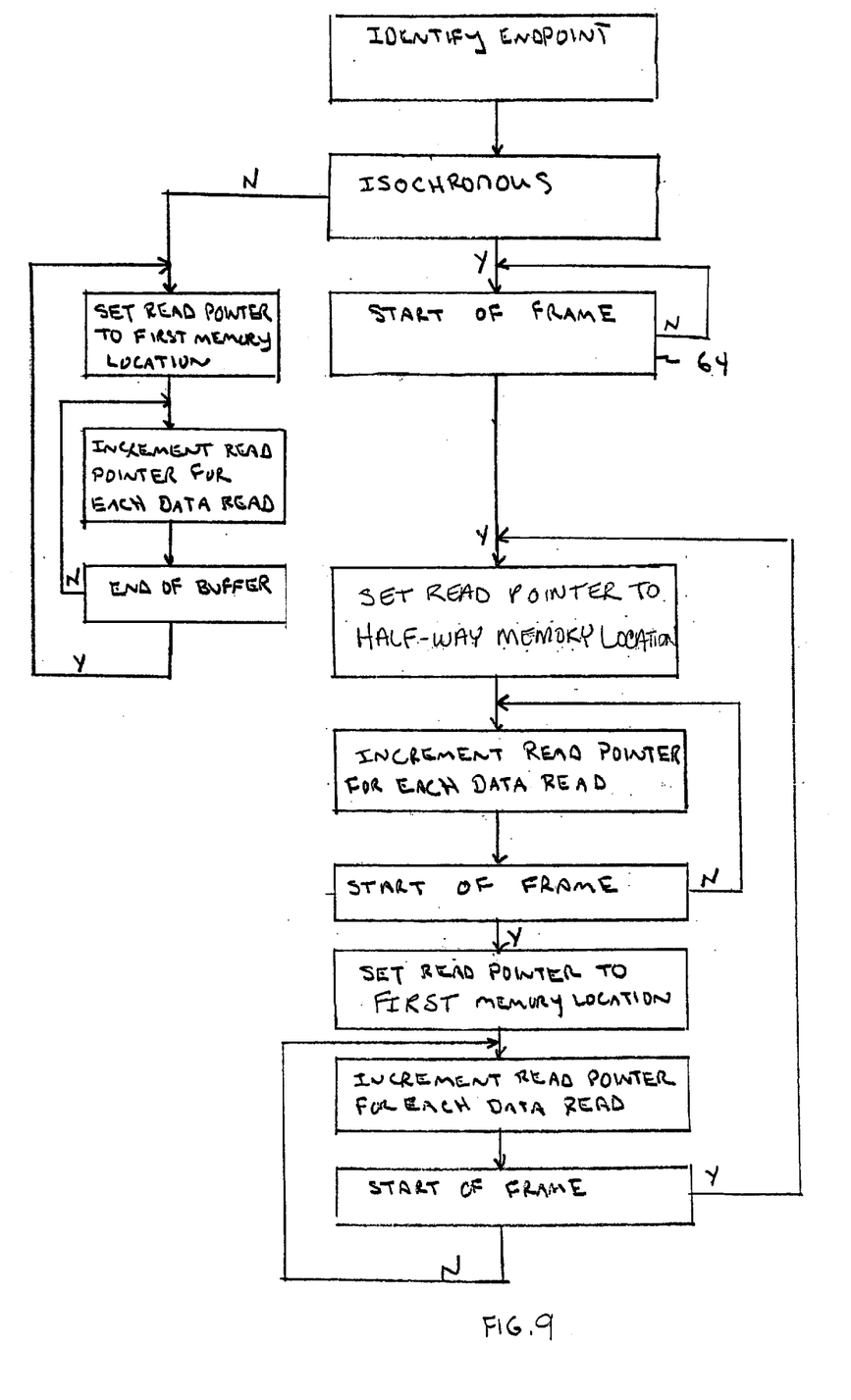

FIG. 9 describes in further detail the read operations controlled by the FIFO controller 26. The read pointer is controlled in a manner similar to the write pointer. However, the read pointer is offset by one frame from the frame currently being written into the memory partition 16.

The pointers that are ping-ponged back and forth between the first and second memory segments in the isochronous mode of the memory 16 are of course only one example. In other implementations, there may be more than two different memory segments configured in the memory 16. In these situations, the pointer is moved from a starting location for the first memory segment, then to the starting location for a second memory segment, then to the starting location for a third memory segment, and so on. When a start of frame is detected and the write pointer is incrementing through the last memory segment (virtual FIFO buffer), the pointer jumps back to the starting location for the first memory segment. The entire process then repeats.

The ability to dynamically change from a ping-pong buffer for isochronous data and a circular FIFO for other types of data helps alleviate many of the problems associated with differences in data rate between the read and the write side of the memory partition 16. This scheme also makes it easy to keep track of what data is associated with each (micro)frame. This is because all of the data in each segments 18 or 20 belongs to only one (micro)frame. Only one register is needed to hold the frame number associated with the data being taken out of the memory 16.

The system described above can use dedicated processor systems, micro controllers, programmable logic devices, or microprocessors that perform some or all of the operations. Some of the operations described above may be implemented in software and other operations may be implemented in hardware.

For the sake of convenience, the operations are described as various interconnected functional blocks or distinct software modules. This is not necessary, however, and there may be cases where these functional blocks or modules are equivalently aggregated into a single logic device, program or operation with unclear boundaries. In any event, the functional blocks and software modules or features of the flexible interface can be implemented by themselves, or in combination with other operations in either hardware or software.

Having described and illustrated the principles of the invention in a preferred embodiment thereof, it should be apparent that the invention may be modified in arrangement and detail without departing from such principles. I claim all modifications and variation coming within the spirit and scope of the following claims.

What is claimed is:

1. An interface controller, comprising:
   a configuration circuit selectively outputting configuration parameters for different endpoints; and
   a controller configuring logic elements in the interface controller according to the selected configuration parameters;
   wherein the logic elements include a memory configurable into multiple partitions with different First In—First Out (FIFO) configurations, the FIFO partition configurations including ping-pong FIFO segments where each of the FIFO segments stores a different frames of isochronous data and a single circular FIFO that stores non-isochronous data.

2. The interface controller according to claim 1 wherein the configuration circuit is generated based on a configuration package associated with the configuration parameters for different endpoints.

3. The interface controller according to claim 1 wherein the logic elements include First In—First Out (FIFO) buffers and Direct Memory Access (DMA) circuitry.

4. The interface controller according to claim 1 including a Universal Serial Bus (USB) device core for communicating with a host over a USB bus.

5. A method for configuring a memory for Universal Serial Bus (USB) communication, comprising:
   identifying a USB endpoint; and
   configuring the memory into multiple partitions with different First In—First Out (FIFO) configurations according to a type of data associated with the identified USB endpoint;
   configuring a memory partition into a ping-pong FIFO when the USB endpoint is associated with isochronous data; and
   configuring a memory partition into a circular FIFO when the USB endpoint is associated with non-isochronous data.

6. The method according to claim 5 including configuring the memory partition into the ping-pong FIFO by switching a pointer between a first memory segment and a second memory segment for each new frame identified in the isochronous data.

7. The method according to claim 6 including switching a write pointer between the first memory partition segment and the second memory partition segment for each new frame identified in the isochronous data and switching a read pointer between the first memory partition segment and the second memory partition segment in an opposite order with the write pointer.

8. The method according to claim 6 including configuring the memory partition for the circular FIFO by setting the pointer to a beginning memory location, incrementing the pointer for each data access, and setting the pointer back to the beginning memory location when the pointer reaches a last memory location.

9. The method according to claim 5 including configuring the memory according to configuration values generated by a configuration circuit.

10. The method according to claim 9 including generating the configuration circuit from a configuration package and varying the configuration circuit for different endpoints, FIFO size and structure, and DMA architectures by varying parameters in the configuration package.

11. The method according to claim 9 including loading the configuration values into the configuration circuit during an initialization process.

12. A circuit, comprising:
    a memory;
    a controller configuring the memory into multiple partitions with different First In—First Out (FIFO) configurations according to a type of data stored in the memory;
    wherein the controller in a first FIFO configuration moves a Pointer back and forth between different FIFO segments in the memory partition for every new data frame and the controller in a second FIFO configuration moves the pointer circularly around a single FIFO in the memory partition.

13. The circuit according to claim 12 wherein the different FIFO segments in the first FIFO configuration are sized to store isochronous data frames.

14. The circuit according to claim 12 including a configuration circuit containing configuration parameters used by the controller for configuring the memory into partitions with the different FIFO configurations.

15. The circuit according to claim 14 wherein the configuration parameters include a start address, FIFO size, read pointer and write pointer for different endpoints.

16. The circuit according to claim 14 including selection circuitry that selectively outputs configuration parameters from the configuration circuit according to an endpoint value.

17. The circuit according to claim 14 wherein the configuration circuit is generated from a configuration package containing endpoint parameters, the configuration circuit varied for different endpoints by changing the endpoint parameters in the configuration package.

* * * * *

UNITED STATES PATENT AND TRADEMARK OFFICE
CERTIFICATE OF CORRECTION

PATENT NO. : 6,745,264 B1
DATED : June 1, 2004
INVENTOR(S) : Luke et al.

It is certified that error appears in the above-identified patent and that said Letters Patent is hereby corrected as shown below:

Title page,
Item [56], References Cited, U.S. PATENT DOCUMENTS,
"2002/0078283 A1 * 6/2002    Pucell et al...710/109" should read
-- 2002/0078283 A1 * 6/2002    Purcell et al...710/109 --.

Column 8,
Line 1, "to claim 6 including" should read -- to claim 5 including --.
Line 27, "a Pointer back" should read -- a pointer back --.

Signed and Sealed this

Twenty-eighth Day of December, 2004

JON W. DUDAS
*Director of the United States Patent and Trademark Office*